May 22, 1962 A. T. BROWN III 3,036,276

AUTOMATIC GAIN CONTROL CIRCUIT

Filed June 26, 1958

Inventor
ALEX T. BROWN III
By Alfred C. Hill
Agent

United States Patent Office 3,036,276 Patented May 22, 1962

3,036,276
AUTOMATIC GAIN CONTROL CIRCUIT

Alex T. Brown III, Wayne, N.J., assignor to International Telephone and Telegraph Corporation, Nutley, N.J., a corporation of Maryland Filed June 26, 1958, Ser. No. 744,702
14 Claims. (Cl. 330—138)

Figure 1:
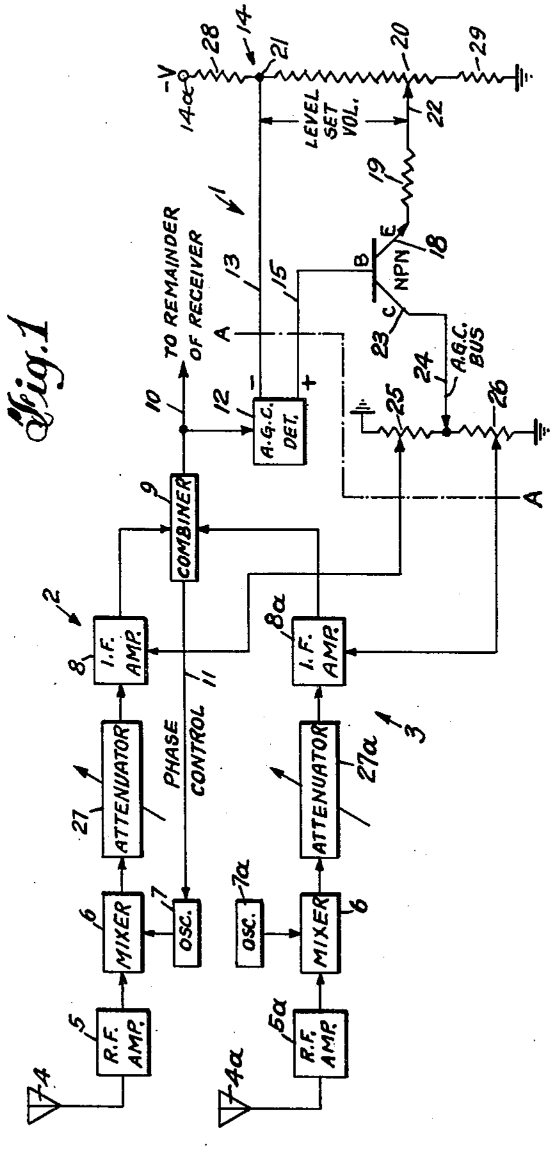

This invention relates to automatic gain control circuits and more particularly to amplified delayed automatic gain control circuits.

The term "delayed automatic gain control (AGC) circuit" employed herein is defined as an AGC circuit which enables an amplifier system to operate at a given gain until the signal passing through the amplifier system exceeds a predetermined level at which time the AGC circuit will function in a manner to reduce the gain of the amplifier system to maintain a signal output from the amplifier system at substantially said predetermined level.

An object of this invention is to provide a novel amplified delayed AGC circuit employing a transistor amplifier.

Another object of this invention is to provide a transistor amplifier in a delayed AGC circuit providing a very close control of the amplitude of the output signal from the controlled amplifier system once said output signal has achieved a predetermined amplitude.

Still another object of this invention is the provision of a transistorized amplified delayed AGC circuit to control the gain of a plurality of amplifier systems equally.

A feature of this invention is to provision of a transistor amplifier to amplify an AGC control signal indicative of the amplitude of the output signal of the amplifier system for application to said amplifier system to control the gain thereof and a voltage source coupled to said transistor amplifier to render said transistor non-conductive below a given level of said control signal and conductive above said given level.

Another feature of this invention is the provision of a voltage source having a given value of voltage coupled to the emitter electrode of the transistor amplifier employed in the delayed AGC circuit of this invention to render the transistor amplifier non-conductive until such time that the AGC control signal and hence the amplifier system output signal exceeds said given value of voltage.

Still another feature of this invention is the provision of a delayed AGC circuit enabling the operation of the amplifier system being controlled at full gain until such time as the AGC control signal exceeds the bias voltage applied to the transistor amplifier in the delayed AGC circuit of this invention at which time the delayed AGC circuit will function to reduce the gain of the amplifier system to maintain a signal output of the amplifier system at substantially the signal level which overcomes said bias voltage.

A further feature of this invention is the provision of a transistorized amplified delayd AGC circuit which may be modified to operate with either a positive or negative voltage source coupled to the emitter electrode of the transistor amplifier to establish a conduction level for said transistor amplifier.

Figure 2:
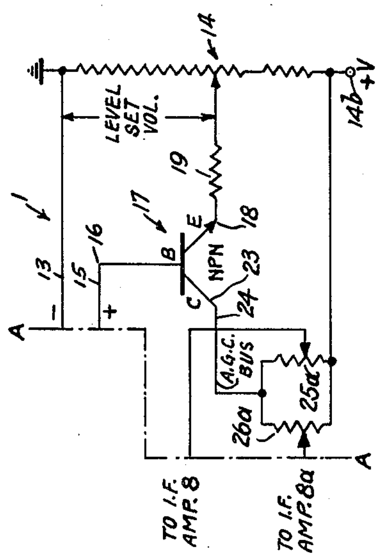

The foregoing and other objects and features of this invention and the manner of attaining them will become more apparent and the invention itself will be best understood by reference to the following description taken in conjunction with the accompanying drawings, in which:

FIG. 1 is a schematic diagram partially in block form of a diversity receiving system incorporating one form of the automatic gain control circuit following the principles of this invention; and FIG. 2 is a schematic diagram of another form of automatic gain control circuit in accordance with the principles of this invention which may be substituted for that portion of the system of FIG. 1 to the right of the dash-dot line A—A.

The AGC circuit of this invention will be described hereinbelow in an operable combination with a diversity receiving system of the equal gain combining type. It is to be remembered, however, that the AGC circuit of this invention is not restricted to its use with a diversity receiving system. The AGC circuit of this invention may be employed to control the gain of any amplifier system which has the requirement of the circuit hereindescribed, that of delayed AGC.

Referring to FIG. 1, one form of the delayed AGC circuit 1 of this invention is illustrated in an cooperative operative arrangement with an equal gain combining diversity receiver. Briefly, the equal gain combining receiver includes two signal channels 2 and 3. Each of the signal channels includes an antenna 4, an RF amplifier 5 to select and amplify the signal induced in antenna 4, a mixer 6 in which the signal present at the output of RF amplifier 5 is heterodyned with the oscillatory signal from oscillators 7 to produce the desired intermediate frequency signal for amplification in intermediate frequency amplifiers 8. The outputs from IF amplifiers 8 and 8*a* are then combined in combiner 9 to provide diversity advantage in the resultant combined signal which is coupled along conductor 10 to the remainder of the diversity receiving system. To achieve the desired diversity advantage in this type of diversity system it is a requirement that the outputs of IF amplifiers 8 and 8*a* are combined in-phase. To assure the proper phase relationships between the signals at the outputs of IF amplifiers 8 and 8*a* for in-phase combining in the combiner 9, a phase detector circuit is included in combiner 9 to detect any phase difference between the desired phase relationship of the outputs of amplifiers 8 and 8*a*. The detection of a phase difference between the phase relation of these two signals produces the phase control signal which is conducted along phase control bus 11 to at least one of the oscillators 7. This phase control signal will operate upon at least one of oscillator 7 to adjust the relative phase relationship between the outputs of the mixers 6 and hence the outputs of amplifiers 8. In this manner the predetermined phase relationship between these two signals is maintained so that these two signals may be combined substantially in-phase in combiner 9. A detailed description of the circuitry which may be included in combiner 9 is disclosed in the co-pending application of R. T. Adams, entitled, "Combining System for Diversity Communication System," Serial No. 737,122, filed May 22, 1958. The manner of obtaining the phase control or adjustment of the output of oscillator 7 may be accomplished by applying the phase control signal to a reactance tube in coupled relation with the oscillator 7 or may be accomplished in the manner described in detail in the co-pending application of R. T. Adams, entitled, "Oscillator Circuit," Serial No 737,754, filed May 26, 1958.

The overall receiving system thus far briefly described is disclosed in detail in the co-pending application of F. J. Altman, A. T. Brown entitled "Radio Diversity Receiving System," Serial No. 26,817, filed May 4, 1960, a continuation-in-part of Serial No. 719,181, filed February 27, 1958, now abandoned. In this co-pending application it is pointed out that the overall receiving system may be employed for either space diversity wherein the antennas 4 are separated by a given distance to achieve a diversity advantage operating at the same radio frequency or the system may operate at a frequency diversity receiving arrangement wherein the oscillators 7 have a desired frequency spread in their output signals to produce at the output of the IF amplifiers 8 an IF signal having the same frequency to enable the accomplishment of the combining of these two signals to achieve the diversity advantage possible by employing equal gain combining diversity arrangement.

To bring about the desired combining in the equal gain combining diversity system, it is required that the IF amplifiers 8 and 8*a* have substantially equal gain under all conditions of signal input. To accomplish this the AGC circuit of this invention which is of the delayed type and identified in FIG. 1, by the reference character 1, is incorporated to provide the desired equal gain in IF amplifiers 8 and 8*a*.

The delayed AGC circuit 1 includes an amplitude or AGC detector 12 to detect the amplitude of the signal at the output of combiner 9 to produce a control signal which is proportional to the amplitude of the signal output from combiner 9. In the arrangement illustrated in FIG. 1 the negative side or reference potential side of the AGC detector, indicated by the minus sign and reference character 13, is connecetd to a point on voltage divider 14 to remove the reference potential of the AGC detector from ground. In this embodiment voltage divider 14 is coupled between ground and a voltage source coupled at terminal 14*a* having negative polarity. Conductor 13 is then coupled to point 21 on voltage divider 14 to provide the desired negative reference potential for AGC detector 12.

The control signal output from the AGC detector 12 is coupled along conductor 15 to the base electrode 16 of transistor amplifier 17. The emitter electrode 18 of the transistor amplifier 17 is coupled through a current limiting resistor 19 to a potentiometer 20 included as a portion of voltage divider 14 to enable the establishment of a level set voltage to thereby control the conduction of transistor amplifier 17. As illustrated in FIG. 1 the level set voltage is developed between point 21 and the potentiometer arm 22 on voltage divider 14. This level set voltage thereby renders the emitter electrode 18 positive with respect to the base electrode 16 of a transistor amplifier 17. This relative voltage difference between the base electrode 15 and emitter electrode 18 of amplifier 17 should be of sufficient value to bias transistor amplifier 17 to non-conduction until such time as the control signal from the AGC detector 12 and hence the output signal from combiner 9 exceeds this level set voltage. At the time that the amplitude of the output signal from combiner 9 exceeds the level set voltage or in other words when a control output of the AGC detector 12 exceeds this level set voltage the transistor amplifier 17 will begin to conduct. The collector current that is produced from collector electrode 23 at the time of conduction of transistor amplifier 17 is then coupled along AGC bus 24 to control the gain of the amplifiers 8. The amplified AGC control signal is coupled along the AGC bus 24 in the system illustrated herein to a pair of potentiometers 25 and 26 from which a given amount of the amplified AGC control signal is coupled to preferably the control grids of IF amplifiers 8 and 8*a*, respectively, to provide equal gain in these amplifiers to thereby enable the equal gain combining of the diversity signals. The action of the amplified AGC signal coupled through AGC bus 24 and potentiometers 25 and 26 is to lower the AGC bias on the control grids of amplifiers 8 and 8*a* to a negative value.

In operation when the signal at the output combiner 9 is below the predetermined signal level set by the level set voltage produced in voltage divider 14 the transistor amplifier 17 is rendered non-conductive thereby providing zero voltage on the AGC bus giving maximum IF gain in the amplifiers 8 and 8*a*. As the combiner 9 output and hence the AGC control signal approaches the value of the level set voltage transistor amplifier 17 begins to conduct. The collector current produced by the conduction of transistor amplifier 17 lowers the AGC bias applied along AGC bus 24 to a negative value. A balance is finally reached when the AGC bias sets the proper amplifier gain to maintain a counteracting voltage from the output of combiner 9 to buck out the delay or level set voltage. A very small change in base-emitter voltage causes the base current to change sufficiently to give a large change in the AGC bus voltage thereby producing a very close control of the IF output at the output of combiner 9 approximately in the vicinity of the amplitude established by the level set voltage.

In summary it can be stated that the AGC circuit 1 of this invention includes a means (AGC detector 12) to detect the amplitude of a signal at the output of an amplifier system and produce a control signal proportional to this amplitude, a transistor amplifier 7 coupled to the output of the detector means to amplify the control signal, and means coupled to transistor amplifier 17 to couple the amplified control signal to the amplifier system to control the gain of this amplifier system, and a voltage source coupled to the transistor amplifier 17 to render transistor amplifier 17 non-conductive below a given level of the output of the amplifier system and conductive about this given level. The action of this circuit is to provide a relatively close control of the output of an amplifier system to provide an output signal which is held relatively close to the bias or level set voltage biasing transistor amplifier 17.

For optimum diversity adding in combiner 9, the gain characteristics of the two amplifiers 8 and 8*a* must track relatively close. To accomplish this result, attenuators 27 and 27*a* at the inputs of amplifier 8 and 8*a* are adjusted so that the gain of these amplifiers coincide at zero AGC control signal. If amplifier 8*a* has a higher gain than amplifier 8, this preferably is accomplished by maintaining attenuator 27 at zero attenuation and inserting attenuation in attenuator 27*a* to reduce the gain of amplifier 8*a* to coincide with the gain of amplifier 8. The tracking of the gain of amplifiers 8 and 8*a* and the amount of AGC signal coupled to these two amplifiers to maintain substantially equal gain in these two amplifiers is then provided by an appropriate adjustment of potentiometers 25 and 26. Through the employment of these two potentiometers 25 and 26 it is possible to adjust the slope of gain characteristics of amplifiers 8 and 8*a* such that when the AGC circuit is in operation the gain characteristic of these two amplifiers track each other very closely over the whole range of gain control and hence provide the desired equal gain characteristics in amplifiers 8 and 8*a* to provide equal gain combining in combiner 9. Preferably, the slope of the gain characteristics of only one amplifier is changed. This is accomplished by fixing one of the potentiometers to pass all of the control signal and adjusting the other potentiometer to make the slope of the gain characteristics of its associated amplifier coincide with the slope of the gain characteristic of the other amplifier.

In a successful reduction to practice, I have employed the following components and component values for the AGC circuit illustrated in FIG. 1. The following is a list of such components;

| | |
|---|---|
| Transistor amplifier **17** | 2N78 Transistor. |
| Resistor **19** | 180 ohms. |
| Voltage at terminal **14***a* | −75 volts. |
| Resistor **28** | 6800 ohms. |
| Potentiometer **20** | 100 ohms. |
| Resistor **29** | 1000 ohms. |
| Voltage at point **21** | approx. −11 volts. |
| Potentiometer **25** | 100,000 ohms. |
| Potentiometer **26** | 100,000 ohms. |

Employing the above listed component values, the AGC circuit of FIG. 1 has successfully controlled the gains of amplifiers 8 and 8*a* as described hereinabove. It is also possible as pointed out hereinabove to employ the gain control circuit 1 in a single channel receiver or other systems requiring AGC to control the gain of a single amplifier or amplifier system.

Referring to FIG. 2 there is shown another form of AGC circuit 1 of this invention. The circuit of FIG. 2 operates substantially in the same manner as described in connection with FIG. 1 and includes the same components such as transistor amplifier 17 and voltage divider 14 to provide the desired level set voltage to bias amplifier 17 into non-conduction when the signal output of AGC detector 12 is below a given value set by the level set voltage of voltage divider 14. Once the control signal exceeds this level set voltage applied to emitter electrode 18, the transistor amplifier 17 will function as described hereinabove to control the gain of the amplifier circuits 8 and 8*a* to provide substantially equal gain therein and to maintain the output of combiner 9 at substantially the level set by the level set voltage. The difference between the circuit of FIG. 2 and the circuit of FIG. 1 is the bias voltage produced in voltage divider 14 and the connection of the potentiometers 25*a* and 26*a*. To terminal 14*b* is applied a positive voltage to be divided in voltage divider 14 to provide the desired bias or level set voltage coupled to bias emitter electrode 18. In this particular circuit the reference potential conductor 13 coming from the AGC detector 12 is coupled to ground reference potential rather than a negative reference potential as is present in the circuit illustrated in FIG. 1. In the embodiment illustrated in FIG. 2 as well as the embodiment illustrated in FIG. 1 the emitter electrode is maintained positive with respect to a base electrode by the voltage applied from voltage divider 14 and hence maintains transistor amplifier 17 non-conductive until the input along conductor 15 from AGC detector 12 exceeds this given value at which time the transistor amplifier 17 will function to control the gain characteristics of the amplifiers 8 and 8*a*. The amplified control signal on conductor 24 is coupled to potentiometers 25*a* and 26*a* as in FIG. 1. However, rather than having the potentiometers returned to ground, the potentiometers are returned to terminal 14*b*.

In operation, before the AGC circuit is connected into the system, the amplifiers 8 and 8*a* are adjusted to be biased to substantially cut-off when the grids are grounded. The transistor amplifier 17 and its associated circuits is then connected into the system and hence return the grids of amplifiers 8 and 8*a* to a positive potential. By virtue of the fact that potentiometers 25*a* and 26*a* are returned to terminal 14*b*, amplifiers 8 and 8*a* operate at full gain when transistor amplifier 17 is non-conductive. As soon as transistor amplifier 17 is rendered conductive, the bias applied to amplifiers 8 and 8*a* is reduced, made more negative, and hence reduces the gain of amplifiers 8 and 8*a*.

While terminal 14*b* is shown as having a separate voltage source applied thereto, this could be connected to the cathode of the amplifier being controlled and, hence, the voltage which renders the amplifier cut-off before the AGC circuit operates is connected into the amplifier system. This arrangement would perform best to control the gain of single stage amplifier.

The transistor amplifier employed in AGC circuit 1 of both FIGS. 1 and 2 is illustrated to be NPN type transistors. It should be obvious to one skilled in the art that PNP type transistors could be substituted for those illustrated in the circuit of FIGS. 1 and 2 with the appropriate adjustments in the bias voltage delivered from the voltage divider to bias the transistor amplifier non-conductive below a given level and conductive above a given level. The bias level should be such, when employing a PNP type transistor, to render the emitter electrode negative with respect to the base electrode. With this change the operation of the AGC circuit employing the PNP type transistor will be the same as described hereinabove with respect to the NPN type transistor amplifier.

While I have described above the principles of my invention in connection with specific apparatus, it is to be clearly understood that this description is made only by way of example and not as a limitation to the scope of my invention as set forth in the objects thereof and in the accompanying claims.

I claim:

1. An amplified automatic gain control circuit operable to control the gain of a plurality of amplifier systems equally, each of said amplifier systems having an input terminal coupled to a source of signal to be amplified, an output terminal, and a gain control terminal comprising a means to combine the signals at the output terminals of said amplifier systems substantially in-phase to produce a single signal therefrom, means coupled to said combining means to detect the amplitude of the signal at the output of said combining means and to produce a control signal proportional to said amplitude, a transistor amplifier coupled to the output of said detector means to amplify said control signal, means coupled to said transistor amplifier to couple said amplified control signal to the gain control terminal of each of said amplifier systems to control the gain of each of said amplifier systems equally in accordance with said amplified control signal and a bias source coupled to said transistor amplifier to render said transistor amplifier non-conductive below a given level of said control signal and conductive thereabove.

2. An amplified automatic gain control circuit operable to control the gain of a plurality of amplifier systems equally, each of said amplifier systems having an input terminal coupled to a source of signal to be amplified, an output terminal, and a gain control terminal comprising a means to combine the signals at the output terminals of said amplifier systems substantially in-phase to produce a single signal therefrom, means coupled to said combining means to detect the amplitude of the signal at the output of said combining means and to produce a control signal proportional to said amplitude, a transistor amplifier to amplify said control signal including at least three electrodes, means coupling the output of said detector to one of said electrodes, means coupling another of said electrodes to the gain control terminal of each of said amplifier systems to control the gain of each of said amplifier systems equally in accordance with said amplified control signal, said last-mentioned means including a plurality of potentiometers, one of said potentiometers being coupled to each of said gain control terminals to equalize the gain characteristics of said amplifier systems and a conductor coupled to said another of said electrodes and each of said potentiometers to supply said amplified control signal thereto for application to their respective ones of the gain control terminals of said amplifier systems, a voltage source having a given value of voltage and means coupling still another of said electrodes to said voltage source to render said transistor amplifier non-conductive until said control signal exceeds said given value of voltage.

3. An amplified automatic gain control circuit operable to control the gain of a plurality of amplifier systems equally, each of said amplifier systems having an input terminal coupled to a source of signal to be amplified, an output terminal, and a gain control terminal comprising a means to combine the signals at the output terminals of said amplifier systems substantially in-phase to produce a single signal therefrom, means coupled to said combining means to detect the amplitude of the signal at the output of said combining means and to produce a control signal proportional to said amplitude, a transistor amplifier to amplify said control signal including at least three electrodes, means coupling the output of said detector to one of said electrodes, means coupling another of said electrodes to the gain control terminal of each of said amplifier systems to control the gain of each of said amplifier systems equally in accordance with said amplified control signal, said last-mentioned means including a plurality of potentiometers, one of said potentiometers being coupled to each of said gain control terminals to equalize the gain characteristics of said amplifier systems and a conductor coupled to said another of said electrodes and each of said potentiometers to supply said amplified control signal thereto for application to their respective ones of said gain control terminals, a voltage source, a voltage divider coupled between said voltage source and ground potential including a movable tap disposed for movement along a given portion of said voltage divider to enable the selection of a given value of voltage and means coupling still another of said electrodes to said movable tap to render said transistor amplifier non-conductive until said control signal exceeds said given value of voltage.

4. A circuit according to claim 3, wherein the voltage of said voltage source has a negative polarity with respect to ground and means coupled between a point on said voltage divide and said detector establishes a reference potential for said detector more negative than said given value of voltage.

5. A circuit according to claim 3, wherein the voltage of said voltage source has a positive polarity with respect to ground and means coupled between ground and said detector establishes a reference potential for said detector more negative than said given value of voltage.

6. An amplified automatic gain control circuit operable to control the gain of a plurality of amplifier systems equally, each of said amplifier systems having an input terminal coupled to a source of signal to be amplified, an output terminal, and a gain control terminal comprising a means to combine the signals at the output terminals of said amplifier systems substantially in-phase to produce a single signal therefrom, means coupled to said combining means to detect the amplitude of the signal at the output of said combining means and to produce a control signal proportional to said amplitude, a transistor to amplify said control signal including a base electrode, a collector electrode and an emitter electrode, means coupling the output of said detector to said base electrode, means coupling said collector electrode to the gain control terminal of each of said amplifier systems to control the gain of each of said amplifier systems equally in accordance with said amplified control signal, said last-mentioned means including a plurality of potentiometers, one of said potentiometers being coupled to each of said gain control terminals to equalize the gain characteristics of said amplifier systems and a conductor coupled to said collector electrode and each of said potentiometers to supply said amplified control signal thereto for application to their respective ones of said gain control terminals, a voltage source having a given value of voltage, means coupling said emitter electrode to said voltage source to render said transistor amplifier non-conductive until said control signal exceeds said given value of voltage.

7. A circuit according to claim 6, wherein the voltage of said voltage source has a negative polarity with respect to ground and means coupled between a point on said voltage divider and said detector establishes a reference potential for said detector more negative than said given value of voltage.

8. A circuit according to claim 6, wherein the voltage of said voltage source has a positive polarity with respect to ground and means coupled between ground and said detector establishes a reference potential for said detector more negative than said given value of voltage.

9. An amplified automatic gain control circuit operable to control the gain of a plurality of amplifier stages comprising a detector having two output terminals, means coupling the input of said detector to the output of said amplifier stages to produce a gain control signal proportional to the amplitude of the output signal therefrom, a voltage source, a voltage divider coupled between said voltage source and ground potential including a movable tap disposed for movement along a given portion of said voltage divider to enable the selection of a given value of voltage, means coupling one output terminal of said detector to a first point on said voltage divider to establish a reference potential for said detector negative with respect to said given value of voltage, a transistor to amplify said gain control signal including a base electrode, a collector electrode, and an emitter electrode, means coupling said gain control signal from the other terminal of said detector to said base electrode, a plurality of resistors, one end of each of said resistors being connected to said collector electrode and the other end of each of said resistors being connected to a second point on said voltage divider to establish a reference potential for said resistors positive with respect to said given value of voltage, a plurality of movable taps each being coupled to an associated one of said resistors, each of said plurality of movable taps being adjusted to couple a predetermined amplitude of the amplified gain control signal from its associated one of said resistors, means coupling each of said plurality of movable taps to an associated one of said amplifier stages to control the gain thereof in accordance with said predetermined amplitude of the amplifier gain control signal to equalize the gain characteristics of said amplifier stages, and means coupling said emitter electrode to the movable tap of said voltage divider to render said transistor nonconductive until said gain control signal exceeds said given value of voltage.

10. A circuit according to claim 9, wherein the voltage of said voltage source has a negative polarity with respect to said ground potential, said reference potential for said detector is positive with respect to the polarity of the voltage of said voltage source, and said reference potential for said resistors is said ground potential.

11. A circuit according to claim 9, wherein the voltage of said voltage source has a positive polarity with respect to said ground potential, said reference potential for said detector is said ground potential, and said reference potential for said resistors is the voltage of said voltage source.

12. An amplified automatic gain control circuit operable to control the gain of first and second amplifier stages comprising a detector having two output terminals, means coupling the input of said detector to the output of said amplifier stages to produce a gain control signal proportional to the amplitude of the output signal therefrom, a voltage source, a voltage divider coupled between said voltage source and ground potential including a movable tap disposed for movement along a given portion of said voltage divider to enable the selection of a given value of voltage, means coupling one output terminal of said detector to a first point on said voltage divider to establish a reference potential for said detector negative with respect to said given value of voltage, a transistor to amplify said gain control signal including a base electrode, a collector electrode, and an emitter electrode, means coupling said gain control signal from the other terminal of said detector to said base electrode, first and second resistors, one end of each of said resistors being connected to said collector electrode and the other end of each of said resistors being connected to a second point on said voltage divider to establish a reference potential for said resistors positive with respect to said given value of voltage, a first movable tap coupled to said first resistor to couple a first predetermined amplitude of the amplified gain control signal from said first resistor, a second movable tap coupled to said second resistor to couple a second predetermined amplitude of the amplified gain control signal from said second resistor, means coupling said first and second movable taps respectively to said first and second amplifier stages to control the gain of said first and second amplifier stages in accordance with said first and second predetermined amplitude of the amplified gain control signal to equalize the gain characteristics of said amplifier stages, and means coupling said emitter electrode to the movable tap of said voltage divider to render said transistor nonconductive until said gain control signal exceeds said given value of voltage.

13. A circuit according to claim 12, wherein the voltage of said voltage source has a negative polarity with respect to said ground potential, said reference potential for said detector is positive with respect to the polarity of the voltage of said voltage source, and said reference potential for said resistors is said ground potential.

14. A circuit according to claim 12, wherein the voltage of said voltage source has a positive polarity with respect to said ground potential, said reference potential for said detector is said ground potential, and said reference potential for said resistors is the voltage of said voltage source.

References Cited in the file of this patent

UNITED STATES PATENTS

| | | |
|---|---|---|
| 1,719,845 | Martin | July 9, 1929 |
| 2,132,101 | Elliott | Oct. 4, 1938 |
| 2,144,224 | Koch | Jan. 17, 1939 |
| 2,179,414 | Konkle | Nov. 7, 1939 |
| 2,223,982 | Bedford | Dec. 3, 1940 |
| 2,363,985 | Moser | Nov. 28, 1944 |
| 2,383,571 | Shook | Aug. 28, 1945 |
| 2,430,246 | Piety | Nov. 4, 1947 |
| 2,751,446 | Bopp | June 19, 1956 |
| 2,772,388 | Erath et al. | Nov. 27, 1956 |
| 2,773,945 | Theriault | Dec. 11, 1956 |
| 2,835,795 | Kroger | May 20, 1958 |
| 2,838,742 | McManis | June 10, 1958 |
| 2,864,888 | Goodrich | Dec. 16, 1958 |
| 2,878,312 | Goodrich | Mar. 17, 1959 |

OTHER REFERENCES

Chow et al.: I.R.E. Transactions on Broadcast and Television Receivers, BTR–1, No. 2, April 1955, pages 1–15.